(12) United States Patent
Arifeen et al.

(10) Patent No.: US 11,769,752 B2
(45) Date of Patent: Sep. 26, 2023

(54) STACKED SEMICONDUCTOR DIE ASSEMBLIES WITH SUBSTRATE HEAT SINKS AND ASSOCIATED SYSTEMS AND METHODS

(71) Applicant: Micron Technology, Inc., Boise, ID (US)

(72) Inventors: Shams U. Arifeen, Boise, ID (US); Christopher Glancey, Boise, ID (US); Koustav Sinha, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 161 days.

(21) Appl. No.: 16/937,861

(22) Filed: Jul. 24, 2020

(65) Prior Publication Data

US 2022/0028826 A1 Jan. 27, 2022

(51) Int. Cl.
*H01L 23/367* (2006.01)
*H01L 25/065* (2023.01)
*H01L 23/373* (2006.01)

(52) U.S. Cl.
CPC ........ *H01L 25/0652* (2013.01); *H01L 23/367* (2013.01); *H01L 23/373* (2013.01); *H01L 2225/06562* (2013.01); *H01L 2225/06589* (2013.01)

(58) Field of Classification Search
CPC . H01L 25/0652; H01L 23/367; H01L 23/373; H01L 2225/06562; H01L 2225/06589
See application file for complete search history.

(56) References Cited

U.S. PATENT DOCUMENTS

| | | | | |
|---|---|---|---|---|
| 6,545,351 B1* | 4/2003 | Jamieson | ............. | H05K 1/0204 257/796 |
| 6,562,653 B1* | 5/2003 | Ma | ..................... | H01L 23/49827 438/125 |
| 6,825,108 B2* | 11/2004 | Khan | .................. | H01L 21/4857 257/734 |
| 7,462,933 B2* | 12/2008 | Zhao | ................... | H01L 23/3735 257/E23.101 |
| 7,579,217 B2* | 8/2009 | Zhao | ................... | H01L 23/3735 257/E23.101 |
| 7,646,093 B2* | 1/2010 | Braunisch | ............ | H05K 1/0204 438/117 |
| 10,134,711 B2* | 11/2018 | Lin | ........................ | H01L 25/50 |
| 10,163,861 B2* | 12/2018 | Yu | ..................... | H01L 23/49816 |

(Continued)

*Primary Examiner* — Eugene Lee
(74) *Attorney, Agent, or Firm* — Perkins Coie LLP

(57) ABSTRACT

Stacked semiconductor die assemblies with heat sinks and associated methods and systems are disclosed. In some embodiments, a controller carrying one or more memory dies may be attached to a front side of a substrate. The substrate may include a heat sink formed on its back side such that the heat sink can establish a thermal contact with the controller. Further, the heat sink may be coupled to a thermally conductive pad of a printed circuit board (PCB) that carries the substrate. In this manner, the controller may be provided with a heat path toward the PCB to dissipate thermal energy generated during operation. In some cases, the substrate may include a set of thermal vias extending from the heat sink toward the controller to enhance the thermal contact between the controller and the heat sink.

20 Claims, 5 Drawing Sheets

(56) References Cited

U.S. PATENT DOCUMENTS

| | | | |
|---|---|---|---|
| 2002/0074668 A1* | 6/2002 | Hofstee | H01L 25/0657 257/737 |
| 2008/0001283 A1* | 1/2008 | Lee | H01L 25/0657 257/E23.102 |
| 2010/0103604 A1* | 4/2010 | Jafari | H01L 25/18 361/679.46 |
| 2012/0049365 A1* | 3/2012 | Ko | H01L 23/5389 257/E23.021 |
| 2012/0075807 A1* | 3/2012 | Refai-Ahmed | H01L 23/49827 257/E23.101 |
| 2014/0293563 A1* | 10/2014 | Loo | H05K 1/141 361/767 |
| 2015/0255429 A1* | 9/2015 | Katkar | H01L 21/76898 257/774 |
| 2017/0250166 A1* | 8/2017 | Cheng | H01L 23/5389 |
| 2019/0172816 A1* | 6/2019 | Kim | H01L 23/295 |
| 2019/0189599 A1* | 6/2019 | Baloglu | H01L 23/552 |
| 2020/0006186 A1* | 1/2020 | Pan | H01L 25/50 |
| 2020/0015348 A1* | 1/2020 | Hill | H01L 21/4857 |
| 2020/0051888 A1* | 2/2020 | Lin | H01L 21/4882 |
| 2020/0111720 A1* | 4/2020 | Wan | H01L 23/36 |
| 2020/0312734 A1* | 10/2020 | Su | H01L 23/367 |
| 2021/0035951 A1* | 2/2021 | Tadayon | H01L 23/13 |
| 2021/0210397 A1* | 7/2021 | Kang | H01L 21/565 |
| 2021/0242104 A1* | 8/2021 | Mallik | H01L 24/83 |
| 2021/0249359 A1* | 8/2021 | Patil | H01L 23/552 |
| 2021/0305119 A1* | 9/2021 | Mallik | H01L 23/49568 |
| 2021/0358860 A1* | 11/2021 | Niramarnkarn | H01L 23/4334 |

\* cited by examiner

STACKED SEMICONDUCTOR DIE ASSEMBLIES WITH SUBSTRATE HEAT SINKS AND ASSOCIATED SYSTEMS AND METHODS

TECHNICAL FIELD

The present disclosure generally relates to semiconductor die assemblies, and more particularly relates to stacked semiconductor die assemblies with substrate heat sinks and associated systems and methods.

BACKGROUND

Semiconductor packages typically include one or more semiconductor dies (e.g., memory chips, microprocessor chip, imager chip) mounted on a substrate and encased in a protective covering. The semiconductor die may include functional features, such as memory cells, processor circuits, or imager devices, as well as bond pads electrically connected to the functional features. The bond pads can be electrically connected to corresponding conductive structures of the substrate, which may be coupled to terminals outside the protective covering such that the semiconductor die can be connected to higher level circuitry.

Market pressures continually drive semiconductor manufacturers to reduce the size of die packages to fit within the space constraints of electronic devices, while also pressuring them to increase the functional capability of each package to meet operating parameters. One approach for increasing the processing power of a semiconductor package without substantially increasing the surface area covered by the package is to vertically stack multiple semiconductor dies on top of one another in a single package. A challenge associated with vertically stacked die packages is that the heat generated by the individual dies combines and increases the operating temperatures of the individual dies, the junctions therebetween, and the package as a whole. This can cause the stacked dies to reach temperatures above their maximum operating temperatures ($T_{max}$), especially as the density of the dies in the package increases.

BRIEF DESCRIPTION OF THE DRAWINGS

Many aspects of the present technology can be better understood with reference to the following drawings. The components in the drawings are not necessarily to scale. Instead, emphasis is placed on illustrating clearly the overall features and the principles of the present technology.

DETAILED DESCRIPTION

Figure 1A:
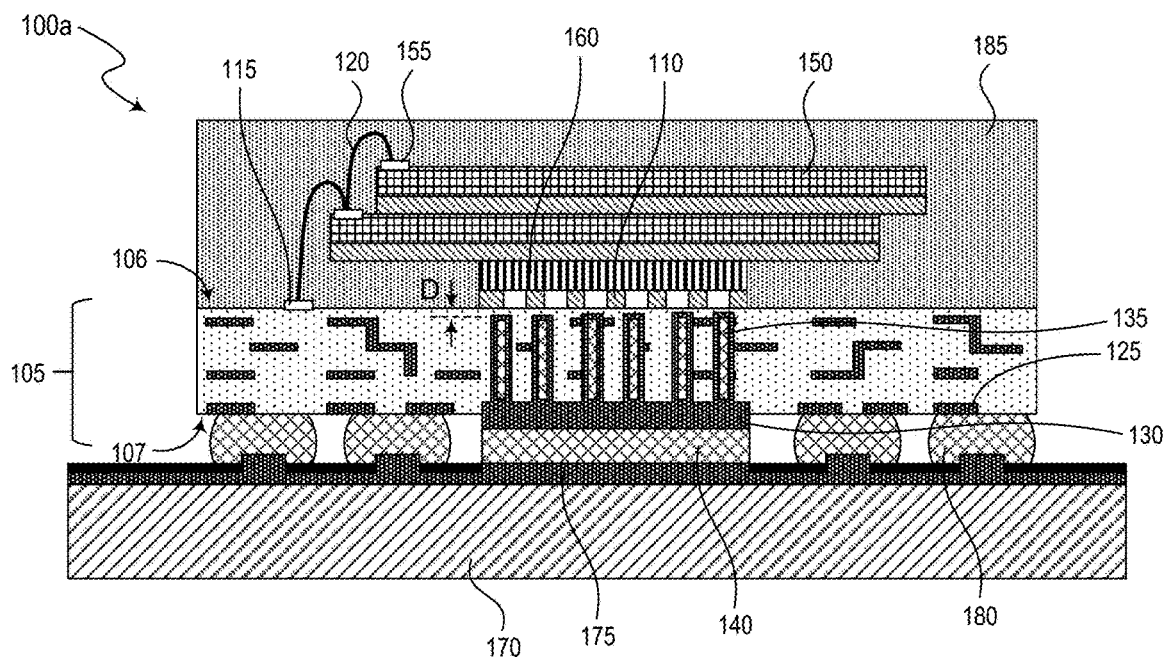
FIGS. 1A and 1B are cross-sectional diagrams of semiconductor die assemblies configured in accordance with embodiments of the present technology.

Specific details of several embodiments of semiconductor die assemblies with heat sinks, and associated systems and methods are described below. The term "semiconductor device or die" generally refers to a solid-state device that includes one or more semiconductor materials. Examples of semiconductor devices include logic devices, memory devices, controllers, or microprocessors (e.g., central processing unit (CPU), graphics processing unit (GPU)), among others. Such semiconductor devices may include integrated circuits or components, data storage elements, processing components, and/or other features manufactured on semiconductor substrates.

In certain packages, a package substrate (which may also be referred to as a support substrate, a substrate, or the like) may carry a controller die (which may also be referred to as a controller, a memory controller, a memory controller die, or the like) and one or more memory dies (e.g., a stack of memory dies). Small form factor packages present challenges to accommodating the controller and the memory dies. In some cases, the controller may be placed in close proximity to the memory dies. For example, the memory dies may be stacked on top of the controller attached to the substrate—e.g., using direct chip attach (DCA) technology—to reduce a foot print of the package.

As speed requirements for the semiconductor die assemblies become more and more demanding, the controller may operate at conditions that can result in a high power density and thus, a high operating temperature. In other words, power over the package foot print increases as the speed of the operation (e.g., data transfer) increases. The memory dies attached to the controller (or placed proximate to the controller) are in thermal contact (i.e., exchanging energy through heat) with the controller, and may accordingly be exposed to a temperature that is higher than a normal temperature range for the memory dies. Such an operating condition may degrade performance of the memory dies and, in some cases, cause the memory dies to suffer from various reliability issues.

The present technology provides additional heat paths for a semiconductor die to dissipate heat such that the overall operating temperature of a semiconductor die assembly may be reduced. Further, the present technology may improve reliability of the package, for example an improved solder joint reliability of the package, by reducing the thermomechanical force induced by the coefficient of thermal expansion (CTE) mismatch owing to a reduced temperature range that the package may experience during operation.

As used herein, the terms "front," "back," "vertical," "lateral," "down," "up," "upper," and "lower" can refer to relative directions or positions of features in the semiconductor device assemblies in view of the orientation shown in the Figures. For example, "upper" or "uppermost" can refer to a feature positioned closer to the top of a page than another feature. These terms, however, should be construed broadly to include semiconductor devices having other orientations. Unless stated otherwise, terms such as "first" and "second" are used to arbitrarily distinguish between the elements such terms describe. Thus, these terms are not necessarily intended to indicate temporal or other prioritization of such elements.

FIG. 1A is a cross-sectional diagram of a semiconductor die assembly 100a ("assembly 100a") configured in accordance with embodiments of the present technology. The assembly 100a may include a substrate 105, a controller 160 attached to the substrate 105, and one or more memory dies 150 ("a stack of memory dies") attached to and operatively coupled with the controller 160. In some embodiments, the one or more memory dies and the controller may be encased in a protective covering (e.g., an encapsulant 185). As shown in FIG. 1A, the assembly 100a may be mounted on a printed circuit board 170 (PCB 170).

The substrate 105 includes a first side 106 (or a front side 106) and a second side 107 (or a back side 107), opposite to the first side 106. The first side 106 of the substrate 105 may include contact pads (e.g., a contact pad 110) and a set of substrate bond pads (e.g., a substrate bond pad 115). In some embodiments, contact pads (e.g., pillars, bumps) can be configured to directly attach to a controller die (e.g., the controller 160)—e.g., using a direct chip attach technology. In some embodiments, individual substrate bond pads are configured to couple with corresponding die bond pads (e.g., a die bond pad 155) of a memory die (e.g., the memory die 150) through bonding wires (e.g., a bonding wire 120).

Further, the second side 107 of the substrate 105 may include a heat sink (e.g., a heat sink 130) configured to provide a heat path from the first side 106 to the second side 107 of the substrate 105 (then to the PCB 170). In some embodiments, the heat sink may be configured to transfer heat away from the controller. In this regard, a location of the heat sink on the second side 107 may generally correspond to where the controller is located on the first side 106—e.g., an area occupied by the heat sink on the second side 107 corresponding to a foot print of the controller on the first side 106. In some embodiments, the heat sink (which may also be referred to as a cooling island) may be coupled to a thermally conductive pad (e.g., a thermally conductive pad 175) of the PCB 170—e.g., to transfer thermal energy from the controller to the PCB. In some embodiments, the thermally conductive pad 175 includes copper pads formed on the PCB.

In addition, the substrate 105 may include a set of interconnect pads (e.g., an interconnect pad 125) on the second side 107 for external communication between the PCB 170 and the controller and/or the memory die—e.g., through solder balls 180 coupling the interconnect pads 125 to various conductive components of the PCB 170. Accordingly, the substrate 105 may include conductive traces (e.g., metal traces and/or electrically conductive vias) embedded therein such that the conductive traces can couple the substrate bond pads 115 or the contact pads 110, or both, with the interconnect pads 125. In some embodiments, the heat sink may occupy an area of the second side 107 of the substrate 105 at least twice (200%) an area of any of the interconnect pads 125. In other embodiments, the heat sink can occupy a different area of the second side 107, such as at least 150%, 300%, 500%, or even greater, of an area of any (e.g., the largest) of the interconnect pads 125. In some embodiments, the area of the heat sink may be determined based on heat the controller die generates during operations—e.g., based on temperature profiles described with reference to FIG. 4.

In some embodiments, the heat sink is located on top of a surface of the second side 107 of the substrate 105. In some embodiments, the heat sink is partially embedded within the surface of the second side 107 of the substrate 105. In some embodiments, the heat sink is recessed below the surface of the second side 107 of the substrate 105. In this regard, the heat sink that is at least partially embedded within the substrate may provide an improved thermal contact with the controller disposed on the opposite side of the substrate (e.g., due to a shorter distance to the controller) and/or an advantage to reduce an overall height of the assembly 100a. In some embodiments, the heat sink 130 includes copper formed by a three-dimensional (3D) printing process, an electroplating process, and/or other suitable techniques. Further, the substrate 105 may include an adhesive (e.g., an adhesive 140) formed on the heat sink 130. The adhesive may be configured to couple the heat sink 130 with the thermally conductive pad 175 of the PCB 170. In some embodiments, the adhesive includes high thermal conductive polymers, a solder alloy, a thermal interface material (TIM), or a combination thereof.

By way of example, the heat sink and the adhesive may be built using 3D printing—e.g., 3D printing a copper slug on the substrate followed by 3D printing of a solder material (e.g., SnAg) on top of the copper slug. Subsequently, the solder material may be conjoined with the thermally conductive pad of the PCB in a single step reflow process while the assembly 100a is attached to the PCB—e.g., during a ball attach step utilizing the solder balls 180. In other examples, the 3D printing of the solder material may be carried out on top of the thermally conductive pad of the PCB. In other examples, the solder material may be screen printed, on top of the heat sink 130 of the substrate 105 or the thermally conductive pad 175 of the PCB 170, or both.

In some embodiments, the heat sink is electrically isolated from the controller (or the assembly 100a including the controller and the memory dies). In this manner, the heat sink may be thermally coupled with the controller to provide a path to dissipate the heat but may not be electrically connected to the controller. In other embodiments, however, the heat sink can be electrically coupled to a ground node of the assembly 100a (including the controller 160)—e.g., through at least one of the thermal vias as described in more detail below.

In some embodiments, the substrate 105 may include a set of thermal vias (e.g., a thermal via 135) coupled to the heat sink 130. The individual thermal vias can extend from the heat sink 130 toward the first side of the substrate 105, where the controller is attached to. The thermal vias, however, may be physically separated from the first side by a distance (e.g., denoted as "D" in FIG. 1A)—i.e., electrically isolated from the controller. In this regard, the thermal vias may be considered to be physically separated from the controller by the distance, as well—i.e., separated by the distance from the contact pads 110 that are electrically connected to the controller 160. In this manner, the thermal vias may be positioned sufficiently close to the controller to establish an improved thermal contact to the controller but electrically isolated from the controller. Accordingly, the controller may be provided with an additional heat path to dissipate heat energy from the controller to the heat sink 130 disposed on the second side (the back side) of the substrate 105. In some embodiments, however, at least one of the thermal vias may reach to the front side such that the thermal vias may be electrically coupled with a ground node of the assembly 100a.

In some embodiments, the controller may include uneven distribution of heat energy—e.g., due to different amount of heat energy that different circuit blocks (e.g., hot spots) of the controller may generate. In such embodiments, a distribution of the thermal vias may be related to a power density distribution of the controller—e.g., locations of thermal vias may be tailored to an overall power density of the controller. By way of example, a region of the substrate corresponding to a hot spot of the controller may include a greater density of thermal vias than other regions. In some embodiments, the substrate may include more than one region of thermal vias—e.g., the substrate may include two or three (or even more) regions of thermal vias that each aim to efficiently dissipate the heat energy generated by the controller. In some embodiments, the thermal vias include one or more materials (e.g., a thermally conductive material, a liner material that facilitates formation of the thermally conductive material, or the like). In some embodiments, the thermal vias may have different cross-sectional shapes—e.g., a circular shape, an elliptical shape, a rectangular shape (i.e., thermal trenches), among others.

Figure 1B:
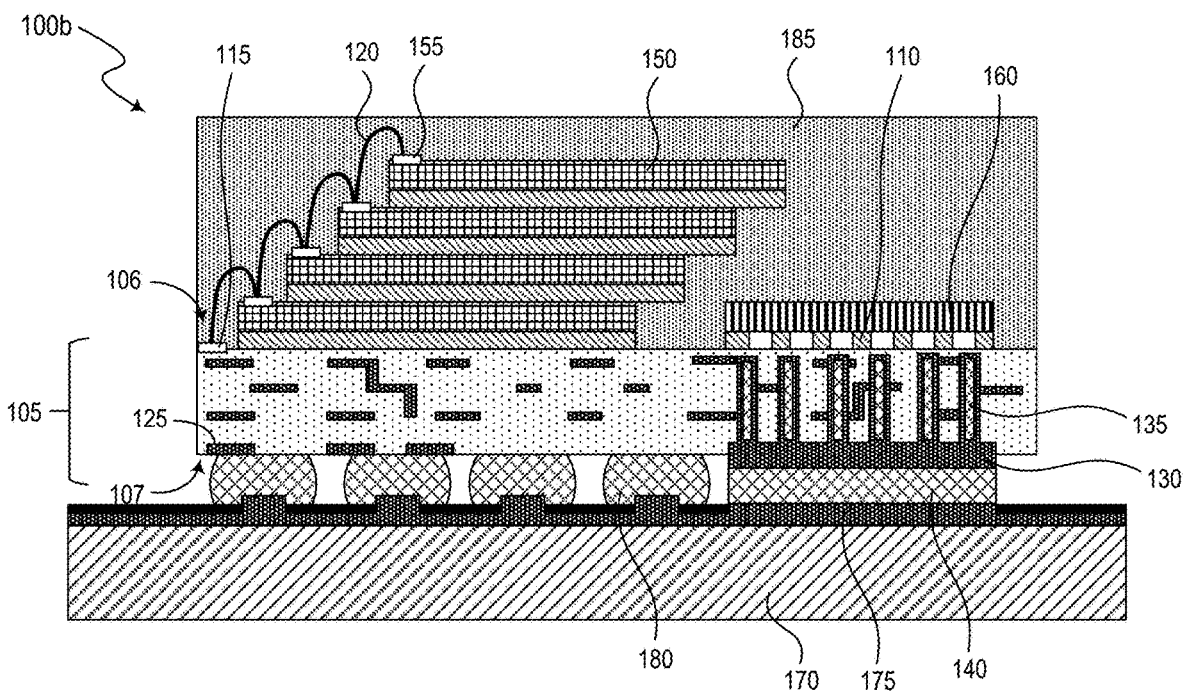

FIG. 1B is a cross-sectional diagram of a semiconductor die assembly 100b ("assembly 100b") configured in accordance with embodiments of the present technology. The assembly 100b can include features generally similar to the features of the assembly 100a described above with reference to FIG. 1A. For example, the assembly 100b includes a substrate 105, a controller 160 attached to the substrate 105, and one or more memory dies 150 ("a stack of memory dies") that are operatively coupled with the controller 160— e.g., through conductive traces of the substrate 105. As shown in FIG. 1B, the assembly 100b may be mounted on a PCB 170. When compared to the assembly 100a described with reference to FIG. 1A, the assembly 100b may provide an improved temperature profile for the memory dies 150 as the memory dies 150 are laterally separated from the controller 160.

Figure 2A:
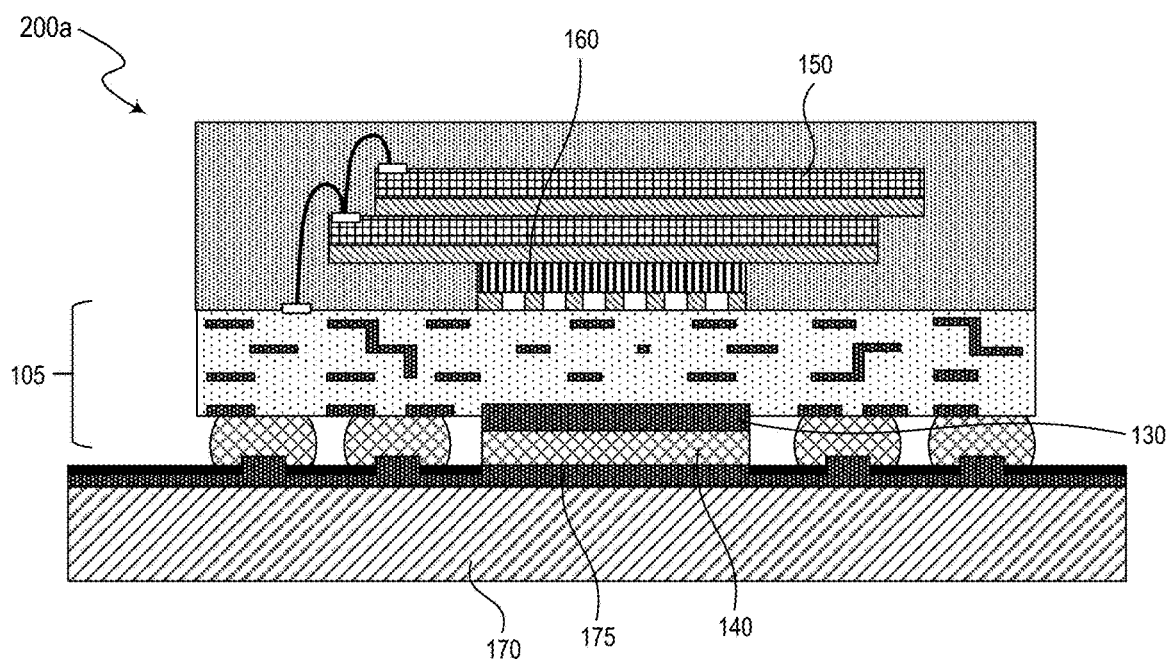
FIGS. 2A and 2B are cross-sectional diagrams of semiconductor die assemblies in accordance with embodiments of the present technology.

FIG. 2A is a cross-sectional diagram of a semiconductor die assembly 200a ("assembly 200a") configured in accordance with embodiments of the present technology. The assembly 200a can include features generally similar to the features of the assembly 100a described above with reference to FIG. 1A. For example, the assembly 200a includes a substrate 105, a controller 160 attached to the substrate 105, and one or more memory dies 150 ("a stack of memory dies") that are attached to the controller 160 and operatively coupled with the controller 160. As shown in FIG. 2A, the assembly 200a may be mounted on a PCB 170.

When compared to the assembly 100a described with reference to FIG. 1A, the substrate 105 in the assembly 200a omits thermal vias. In some embodiments, conductive traces embedded in the substrate 105 may be incompatible for the substrate 105 to include thermal vias described with reference to FIG. 1A. The heat sink 130 may, however, be proximate to the controller 160 such that the heat sink 130 can establish sufficient thermal contact with the controller 160 to provide additional thermal paths for the controller 160. In some embodiments, the conductive traces embedded in the substrate 105 and located between the controller 160 and the heat sink 130 may assist dissipating the heat energy from the controller 160 to the heat sink 130.

Figure 2B:
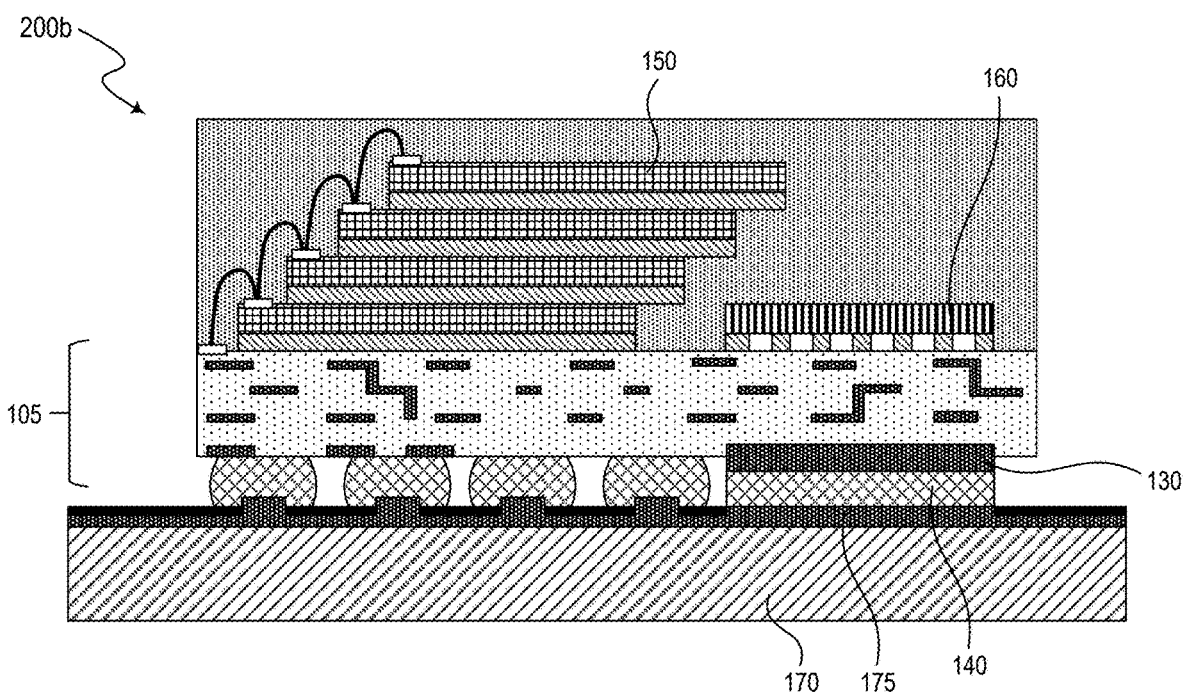

FIG. 2B is a cross-sectional diagram of a semiconductor die assembly 200b ("assembly 200b") configured in accordance with embodiments of the present technology. The assembly 200b can include features generally similar to the features of the assembly 200a described above with reference to FIG. 2A. For example, the assembly 200b includes a substrate 105, a controller 160 attached to the substrate 105, and one or more memory dies 150 ("a stack of memory dies") that are operatively coupled with the controller 160— e.g., through conductive traces of the substrate 105. As shown in FIG. 2B, the assembly 200b may be mounted on a PCB 170. When compared to the assembly 200a described with reference to FIG. 2A, the assembly 200b may provide an improved temperature profile for the memory dies 150 as the memory dies 150 are laterally separated from the controller 160.

Figure 3A:
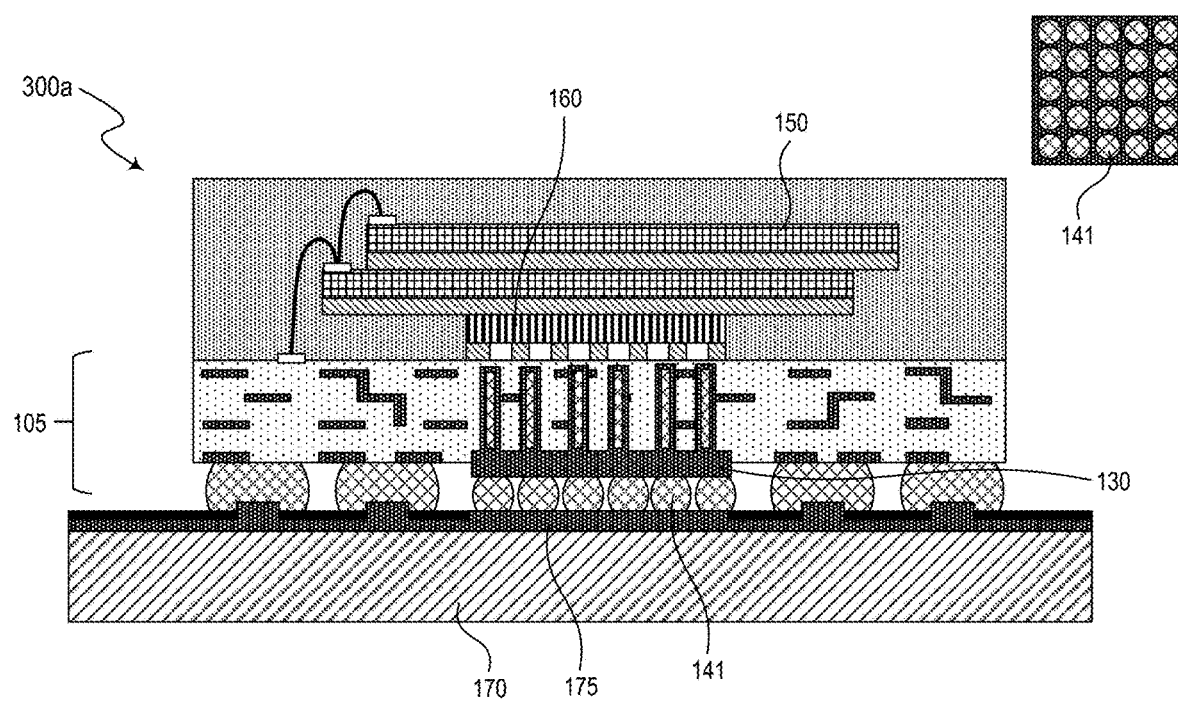
FIGS. 3A and 3B are cross-sectional diagrams of semiconductor die assemblies in accordance with embodiments of the present technology.

FIG. 3A is a cross-sectional diagram of a semiconductor die assembly 300a ("assembly 300a") configured in accordance with embodiments of the present technology. The assembly 300a may be an example of the assembly 100a or can include features generally similar to the features of the assembly 100a described above with reference to FIG. 1A. For example, the assembly 300a includes a substrate 105, a controller 160 attached to the substrate 105, and one or more memory dies 150 ("a stack of memory dies") that are attached to the controller 160 and operatively coupled with the controller 160. As shown in FIG. 3A, the assembly 300a may be mounted on a PCB 170.

When compared to the assembly 100a described with reference to FIG. 1A, the heat sink 130 of the assembly 300a is attached to the thermally conductive pad 175 of the PCB 170 through an array of solder balls (e.g., an array of solder balls 141)—i.e., solder balls arranged in a relatively small pitch as in a ball grid array (BGA) configuration. Each of the solder balls may include a solder alloy.

Figure 3B:
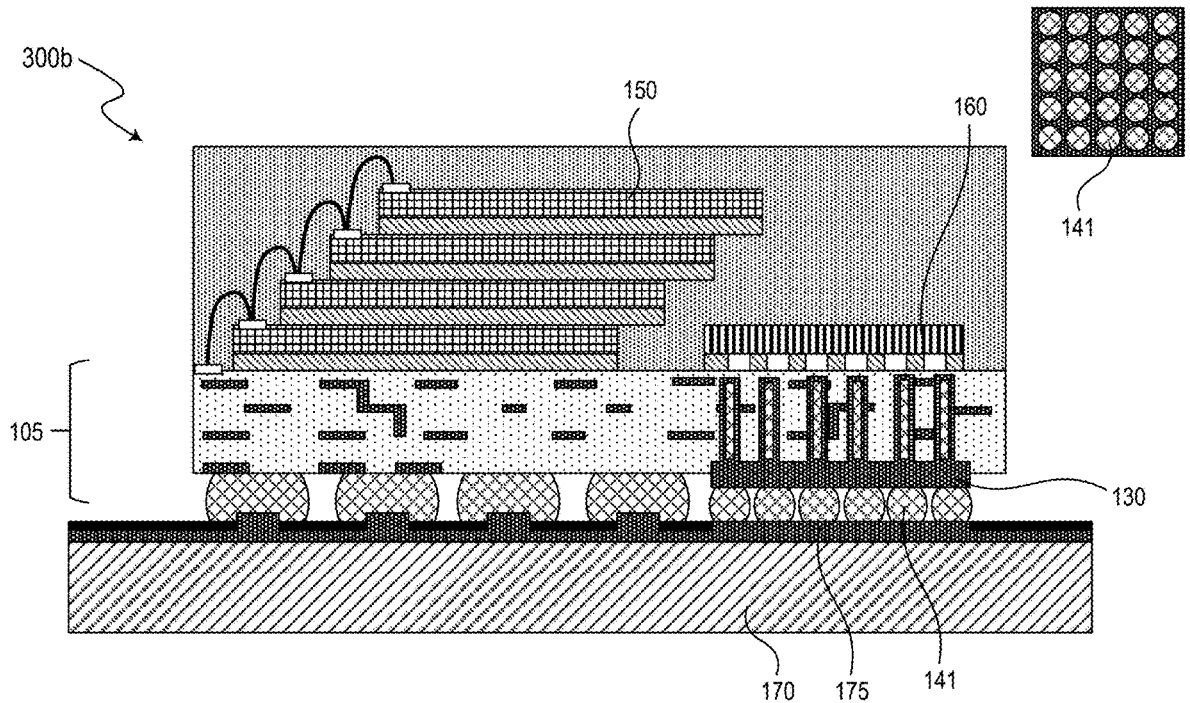

FIG. 3B is a cross-sectional diagram of a semiconductor die assembly 300b ("assembly 300b") configured in accordance with embodiments of the present technology. The assembly 300b may be an example of the assembly 300a or can include features generally similar to the features of the assembly 300a described above with reference to FIG. 3A. For example, the assembly 300b includes a substrate 105, a controller 160 attached to the substrate 105, and one or more memory dies 150 ("a stack of memory dies") that are operatively coupled with the controller 160—e.g., through conductive traces of the substrate 105. As shown in FIG. 3B, the assembly 300b may be mounted on a PCB 170. When compared to the assembly 300a described with reference to FIG. 3A, the assembly 300b may provide an improved temperature profile for the memory dies 150 as the memory dies 150 are laterally separated from the controller 160.

Figure 4:
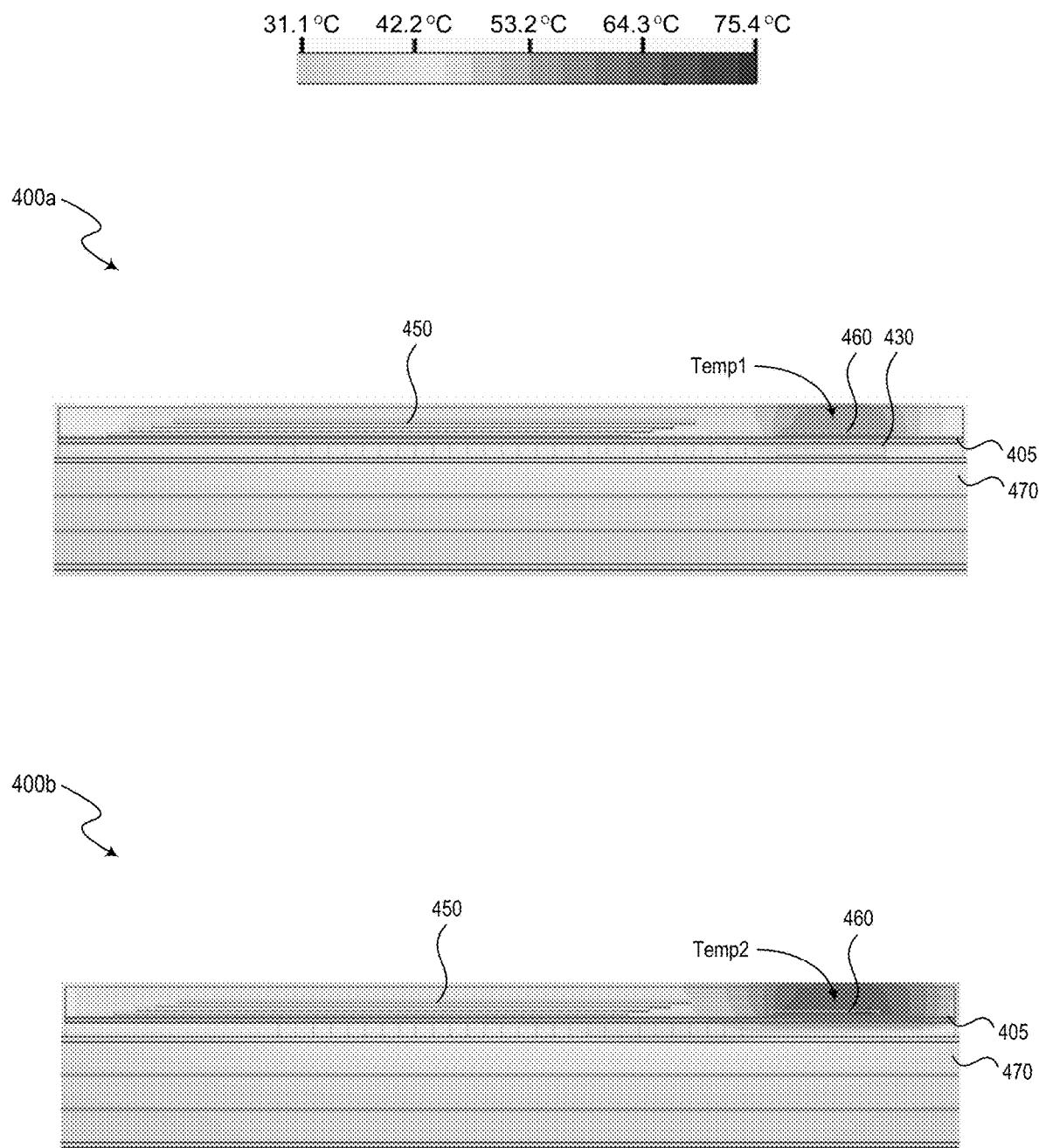
FIG. 4 illustrates temperature profiles of semiconductor die assemblies with and without a heat sink in accordance with embodiments of the present technology.

FIG. 4 illustrates schematic diagrams 400a and 400b including temperature profiles of semiconductor die assemblies with and without a heat sink in accordance with embodiments of the present technology. The temperature profiles are provided to illustrate the principles of the present technology by way of example and the invention is not limited thereto. Diagram 400a includes a semiconductor die assembly that may include aspects of the assemblies 100b, 200b, or 300b described with reference to FIGS. 1B, 2B, and 3B. For example, the semiconductor die assembly of the diagram 400a may include one or more memory dies 450, a controller 460, a substrate 405 that carries both the memory dies 450 and the controller 460. Further, the substrate 405 includes a heat sink 430 (e.g., the heat sink 130) coupled to a thermally conductive pad (e.g., the thermally conductive pad 175) of a PCB 470—e.g., through an adhesive 140 or an array of solder balls 141. In some embodiments, the substrate 405 may include thermal vias (e.g., the thermal vias 135). The temperature profile depicted in the diagram 400a shows that a temperature around the controller 460 is generally higher than that around the memory dies 450, during operation.

The diagram 400b includes another semiconductor die assembly that may include aspects of the semiconductor die assembly included in the diagram 400a. For example, the semiconductor die assembly included in the diagram 400b includes one or more memory dies 450, a controller 460, a substrate 405 that carries both the memory dies 450 and the controller 460. The substrate 405, however, does not include a heat sink. Accordingly, the controller 460 in the diagram 400b lacks a heat path that the heat sink provides toward the PCB 470 and a peak temperature (e.g., Temp2) near the controller 460 may be greater than the peak temperature (e.g., Temp1) of the diagram 400a. In some embodiments, Temp1 may be 10% to 75% less than Temp2.

Figure 5:
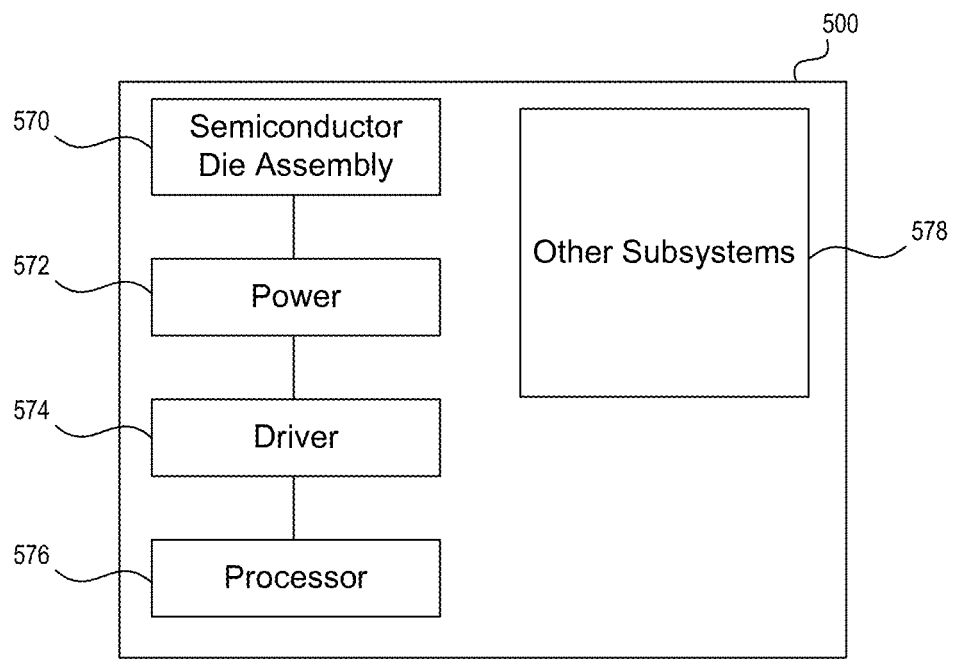
FIG. 5 is a block diagram schematically illustrating a system including a semiconductor die assembly configured in accordance with an embodiment of the present technology.

Any one of the semiconductor die assemblies (e.g., semiconductor die assemblies 100a, 100b, 200a, 200b, 300a, 300b) described above with reference to FIGS. 1A through 3B can be incorporated into any of a myriad of larger and/or more complex systems, a representative example of which is a system 500 shown schematically in FIG. 5. The system 500 can include a semiconductor die assembly 570, a power source 572, a driver 574, a processor 576, and/or other subsystems or components 578. The semiconductor die assembly 570 can include features generally similar to those of the semiconductor die assemblies described above and can therefore include heat sinks that enhance heat dissipation from a controller.

The resulting system 500 can perform any of a wide variety of functions, such as memory storage, data processing, and/or other suitable functions. Accordingly, representative systems 500 can include, without limitation, handheld devices (e.g., mobile phones, tablets, digital readers, and digital audio players), computers, and appliances. Components of the system 500 may be housed in a single unit or distributed over multiple, interconnected units (e.g., through a communications network). The components of the system 500 can also include remote devices and any of a wide variety of computer readable media.

From the foregoing, it will be appreciated that specific embodiments of the technology have been described herein for purposes of illustration, but that various modifications may be made without deviating from the disclosure. For example, although many of the embodiments of the semiconductor die assemblies are described with two (2) or four (4) memory dies, in other embodiments, the semiconductor die assemblies can be configured to have a different quantity (e.g., one, three, six, eight, even more) of memory dies. Further, although the embodiments of the semiconductor die assemblies are described with memory dies arranged in a pattern resembling stair-steps with bonding wires coupling bond pads of the memory dies with corresponding substrate bond pads, the present technology is not limited thereto. For example, the memory dies may be arranged in an in-line stacking configurations having through-substrate vias (TSVs) to reduce a footprint of the die package.

Further, although in the foregoing example embodiments, the substrates having a single heat sink have been described and illustrated, in other embodiments, the substrates may be provided with two or more such heat sinks. In addition, such heat sinks (e.g., multiple heat sinks of the substrates) may be configured to dissipate heat energy from the controller and/or any other discrete components that the substrate may carry. In addition, while in the illustrated embodiments certain features or components have been shown as having certain arrangements or configurations, other arrangements and configurations are possible. For example, the controller may be arranged to be partially under the memory dies in some embodiments, instead of either laterally separated from the memory dies or entirely under the memory dies. Moreover, certain aspects of the present technology described in the context of particular embodiments may also be combined or eliminated in other embodiments.

The devices discussed herein, including a semiconductor device (or die), may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor die assembly, comprising:
   a substrate including a first side and a second side opposite to the first side;
   one or more memory dies disposed over the first side of the substrate;
   a controller die attached to the first side of the substrate and operatively coupled with the one or more memory dies;
   interconnect pads at the second side of the substrate, operatively coupled with the controller die and the one or more memory dies, each interconnect pad having an outer surface facing away from the substrate and an inner surface in contact with the substrate; and
   a heat sink at the second side of the substrate, the heat sink covering an area of the second side at least twice an area of any of the interconnect pads, the heat sink having an outer surface facing away from the substrate and an inner surface in contact with the substrate, the inner surface coplanar with the inner surface of each of the interconnect pads.

2. The semiconductor die assembly of claim 1, wherein the heat sink includes copper formed by a three-dimensional (3D) printing process, an electroplating process, or both.

3. The semiconductor die assembly of claim 1, wherein the heat sink is located on top of a surface of the second side of the substrate.

4. The semiconductor die assembly of claim 1, wherein the heat sink is partially embedded within a surface of the second side of the substrate.

5. The semiconductor die assembly of claim 1, wherein the heat sink is recessed below a surface of the second side of the substrate.

6. The semiconductor die assembly of claim 1, wherein the heat sink is electrically isolated from the controller die.

7. The semiconductor die assembly of claim 1, wherein the heat sink is coupled with a thermally conductive pad of a printed circuit board (PCB) carrying the semiconductor die assembly.

8. The semiconductor die assembly of claim 7, further comprising:
an adhesive coupling the heat sink to the thermally conductive pad, wherein the adhesive includes high thermal conductive polymers, a solder alloy, a thermal interface material, or a combination thereof.

9. The semiconductor die assembly of claim 1, wherein the substrate includes one or more thermal vias coupled to the heat sink, the one or more thermal vias extending toward the controller die attached to the first side of the substrate.

10. The semiconductor die assembly of claim 9, wherein a distribution of the one or more thermal vias is related to a power density distribution generated by the controller die in operation.

11. The semiconductor die assembly of claim 9, wherein the one or more thermal vias are physically separated from the controller die by a distance.

12. The semiconductor die assembly of claim 1, wherein the one or more memory dies includes a stack of memory dies attached to the first side of the substrate.

13. The semiconductor die assembly of claim 1, wherein the one or more memory dies includes a stack of memory dies attached to the controller die.

14. A substrate, comprising:
a first side including contact pads and a plurality of substrate bond pads, wherein the contact pads are configured to directly attach to a controller die and individual substrate bond pads are configured to couple with corresponding die bond pads of a memory die through bonding wires; and
a second side, opposite to the first side, including a heat sink configured to transfer heat from the controller die to a thermally conductive pad of a printed circuit board (PCB) and a plurality of interconnect pads for external communication between the PCB and the controller die and/or the memory die, wherein:
the heat sink occupies an area of the second side at least twice an area of any of the interconnect pads,
the heat sink has an inner surface facing the first side, and
each of the plurality of interconnect pads has an inner surface facing the first side and coplanar with the inner surface of the heat sink.

15. The substrate of claim 14, further comprising:
a set of thermal vias coupled to the heat sink, individual thermal vias of the set extending from the heat sink toward the first side.

16. The substrate of claim 15, wherein individual thermal vias of the set are physically separated from the first side by a distance.

17. The substrate of claim 15, wherein a distribution of the thermal vias of the set is related to a power density distribution of the controller die.

18. The substrate of claim 14, further comprising:
an adhesive formed on the heat sink, the adhesive configured to couple the heat sink with the thermally conductive pad, wherein the adhesive includes high thermal conductive polymers, a solder alloy, a thermal interface material, or a combination thereof.

19. The substrate of claim 14, wherein the heat sink is a first heat sink and the thermally conductive pad is a first thermally conductive pad, and the second side of the substrate further comprises:
a second heat sink configured to transfer heat from the controller die to a second thermally conductive pad of the PCB, wherein:
the second heat sink occupies another area of the second side at least twice the area of any of the interconnect pads.

20. A semiconductor system, comprising:
a semiconductor die assembly, including:
a substrate having a first side and a second side opposite to the first side;
one or more memory dies disposed over the first side of the substrate;
a controller die attached to the first side of the substrate and operatively coupled with the one or more memory dies;
interconnect pads at the second side of the substrate, operatively coupled with the controller die and the one or more memory dies; and
a heat sink at the second side of the substrate, the heat sink covering an area of the second side at least twice an area of any of the interconnect pads,
wherein the heat sink has an inner surface facing the first side, and
wherein each of the plurality of interconnect pads has an inner surface facing the first side and coplanar with the inner surface of the heat sink; and
a printed circuit board (PCB) carrying the semiconductor die assembly, wherein the heat sink of the semiconductor die assembly is coupled with a thermally conductive pad of the PCB.

\* \* \* \* \*